United States Patent [19]
Schadewald, Jr. et al.

[11] Patent Number: 6,150,813
[45] Date of Patent: Nov. 21, 2000

[54] METHOD OF CONNECTING HEADS OF A DATA STORAGE SYSTEM TO A TESTING APPARATUS

[75] Inventors: Frank W. Schadewald, Jr., Bloomington; Mark J. Schaenzer, Eagen, both of Minn.

[73] Assignee: Seagate Technology LLC, Scotts Valley, Calif.

[21] Appl. No.: 09/209,136

[22] Filed: Dec. 10, 1998

Related U.S. Application Data

[62] Division of application No. 08/850,202, May 2, 1997, Pat. No. 5,876,216.
[60] Provisional application No. 60/041,193, Mar. 25, 1997.

[51] Int. Cl.[7] .................................................. G01R 33/00
[52] U.S. Cl. ......................... 324/262; 439/67; 360/128; 365/55
[58] Field of Search ................................. 324/262, 226, 324/210, 211, 212; 439/66, 77; 360/128; 369/53, 55

[56] References Cited

U.S. PATENT DOCUMENTS

| | | |
|---|---|---|
| 3,795,888 | 3/1974 | Nardo et al. ............................ 339/176 |
| 3,848,952 | 11/1974 | Tighe, Jr. .................................. 339/91 |
| 4,060,295 | 11/1977 | Tomkiewicz ............................... 339/17 |
| 4,629,270 | 12/1986 | Andrews, Jr. et al. ..................... 339/75 |
| 4,648,668 | 3/1987 | Sinisi ........................................ 339/74 |
| 5,103,359 | 4/1992 | Marazzo .................................. 360/104 |
| 5,121,273 | 6/1992 | Slezak ..................................... 360/104 |
| 5,154,618 | 10/1992 | Nikoloff et al. ........................... 439/67 |
| 5,495,377 | 2/1996 | Kim ........................................ 360/106 |
| 5,764,497 | 6/1998 | Mizumo .................................. 361/803 |

*Primary Examiner*—Walter E. Snow
*Attorney, Agent, or Firm*—Westman, Champlin & Kelly, P.A.

[57] ABSTRACT

An integrated connector board for a head of a disc drive including a base having a lead, connector pad and insertion connector formed on the base, the lead connector pad and insertion connector being electrically coupled to define a circuit. The connector pad is adapted for connection to a pin type connector terminal and the elongated insertion connector is adapted for connection to an insertion type connector terminal for providing a connector board adapted for use with insertion type connector terminals and pin type connector terminals.

8 Claims, 5 Drawing Sheets

METHOD OF CONNECTING HEADS OF A DATA STORAGE SYSTEM TO A TESTING APPARATUS

REFERENCE TO RELATED APPLICATION

This application is a Divisional application of U.S. Ser. No. 08/850,202, filed May 2, 1997, now U.S. Pat. No. 5,876,216 and entitled "INTEGRATED CONNECTOR BOARD FOR DISC DRIVE STORAGE SYSTEMS".

This application claims priority to Provisional Application Ser. No. 60/041,193, filed Mar. 25, 1997, and entitled "INTEGRATED TERMINATOR PADDLE BOARD".

BACKGROUND OF THE INVENTION

The present invention relates to a disc drive storage system. In particular, the present invention relates to a head connector for electrically connecting a transducing head to a connector of a testing apparatus.

Disc drives systems store data on rigid discs coated with a magnetizable medium having a plurality of circular, concentric data tracks. A head is positioned above the disc surface to read and write data to the disc surface. Particularly, the head includes transducers for reading and writing data to the disc. Each disc surface has a single head associated therewith. The head is designed to fly above the disc surface to read and write data to the disc surface.

Heads are supported via an actuator assembly, which moves to align the heads relative to predetermined concentric data tracks on a disc surface. Actuator assembly is controlled by electronic circuitry in a known manner. Actuator assembly includes an actuator and an actuator block for supporting the heads. Heads are coupled to the actuator block via a head gimbal assembly (HGA) and a load beam. The HGA supports the head so that the head can pitch and roll to follow the topography of the disc surface. The head includes a slider which has an air bearing surface for lifting the head above the disc surface.

Rotation of a disc via a spindle motor causes air to drag under the slider along the air bearing surface in a direction approximately parallel to the tangential velocity of the disc. As the air passes beneath the disc surface, the air pressure between the disc and the air bearing surface creates a hydrodynamic lifting force that causes the slider to lift and fly above the disc surface. A preload force is supplied by the load beam to normally bias the HGA toward the disc surface.

If the head is defective, the head will not properly read and write information to the disc surface. Thus, to assure proper operation of the disc drive, heads are tested by testing apparatus. The transducers of the heads are electrically coupled to a testing apparatus to perform a battery of known tests to verify the electrical parameters of the heads as well as the fly parameters. Additionally, discs are tested to assure the quality of the discs. Heads are used to test disc. Heads are coupled to known disc testing apparatus to read and write data from a test disc. Heads may be electrically coupled to testing apparatus via a head connector board.

Different testing apparatus have different connector terminals. In particular, testing apparatus available from Guzik Technical Enterprises, Inc. of San Jose, Calif. generally incorporate an insertion type connector terminal. Other testing apparatus may incorporate a pin type connector terminal. A head connector board for an insertion type connector terminal is designed for insertion into the connector terminal and includes connector strips which mate with contacts of the connector terminal.

A head connector board for a pin type connector terminal includes connector pads arranged in a predefined pattern corresponding to the pattern of pins of a pin type connector terminal. The pins move between a retracted position spaced from the connector board and an engaged position to contact connector pads to facilitate an electrical connection between the head and the testing apparatus.

Often times, it is desirable to perform a multitude of tests employing different testing apparatus having different connector terminals. Thus, it may be necessary to connect a first head connector board to the head to facilitate use of a first testing apparatus and when complete, removed the first head connector board and attach a second head connector board for operating the second testing apparatus. Since it is cumbersome to attach different head connector boards depending upon the testing apparatus used, it would be desirable to have a system for testing heads using various testing apparatus incorporating both insertion type connector terminals and pin type connector terminals without needing to connect to multiple connector boards.

SUMMARY OF THE INVENTION

The present invention relates to an integrated connector board for a head of a disc drive that is capable of electrically connecting the head to both insertion type connector terminals and pin type connector terminals. The integrated connector board includes a base. A lead, connector pad and insertion connector are formed on the base and are electrically connected via a conductive path.

The connector pad is adapted for connection to a pin type connector terminal and the insertion connector is adapted for connection to an insertion type connector terminal. Preferably, a plurality of leads, connector pads and insertion connectors are included to coupled to multiple wires electrically connected to transducer elements of the head. Thus, as described, the integrated connector board of the present invention provides a connector board that couples the head to apparatus incorporating both pin type insertion connector terminals and insertion type connector terminals.

DETAILED DESCRIPTION OF THE PREFERRED EMBODIMENTS

Figure 1:
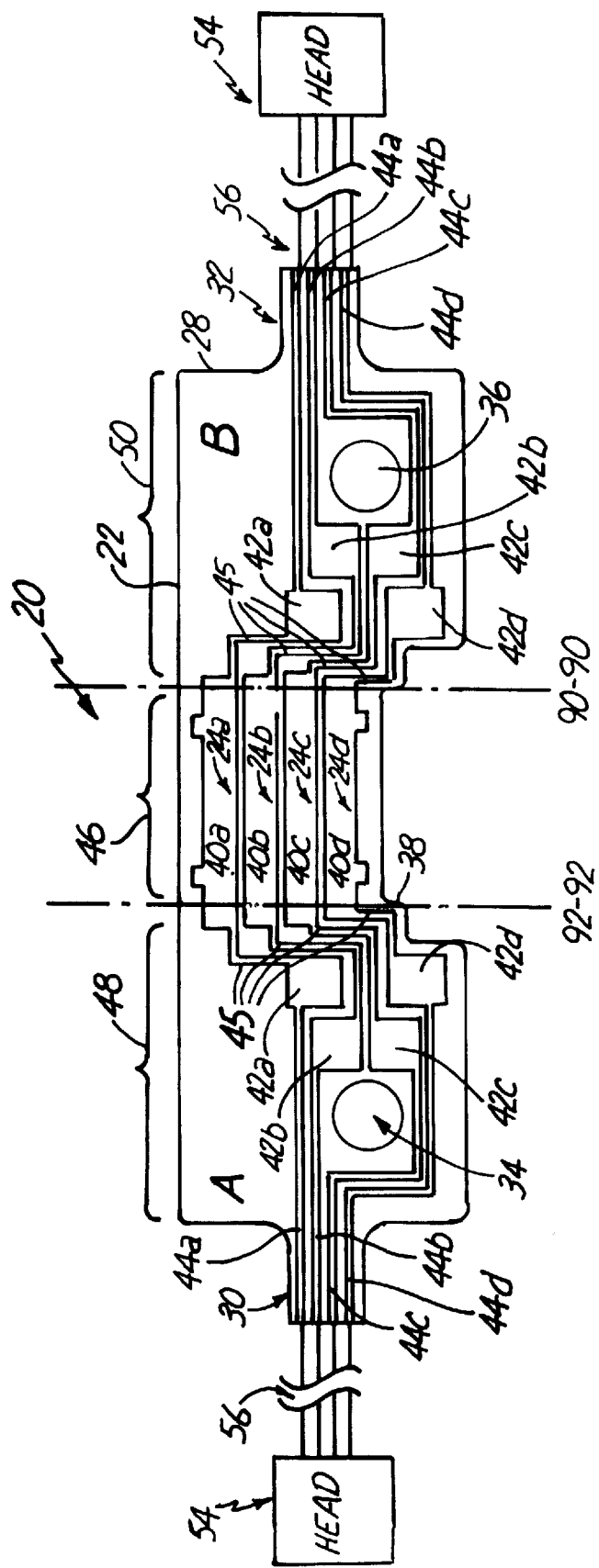
FIG. 1 is a plan view of an integrated connector board of the present invention.

The present invention relates to an integrated connector board 20 as shown in FIG. 1. The integrated connector board 20 includes a base 22 and a plurality of circuits 24a–d. Multiple circuits 24a–d are included to connect to multiple wires coupled to transducer elements on the head for reading and writing data. Base 22 is formed of a non-conductive material such as a polyimide material. The base 22 is shaped to define a main portion 28, opposed extension tabs 30 and 32, opposed mounting holes 34 and 36 and a recessed channel 38. Extension tabs 30 and 32 extend from opposed ends of the main portion 28.

The circuits 24a–d include elongated insertion connectors 40, connector pads 42 and leads 44 formed of a conductive material. The elongated insertion connectors 40 and connector pads 42 are electrically coupled to one another and are electrically coupled to leads 44 via conductive paths 45 to form circuits 24a–d. Main portion 28 of base includes a center portion 46, and first and second side portions 48 and 50 which extend from opposed sides of the center portion 46. Preferably elongated insertion connectors 40 are formed on the main portion 28 and connector pads 42 are formed on both first and second side portions 48 and 50. Leads 44 are formed on opposed extension tabs 30 and 32.

Thus, the design of the connector board 20 shown in FIG. 1 provides a first lead-connector pad-insertion connector circuit portion formed by tab 30, side portion 48, and center portion 46; and a second lead-connector pad-insertion connector circuit portion formed by tab 32, side portion 50, and center portion 46 to define separate operating circuit portions on connector board 20. Since center portion 46 is between side portions 48 and 50, the insertion connectors 40 on center portion 46 are coupled to connector pads 42 on both side portions 48, 50 and leads 44 on both tabs 30, 32. Preferably, the insertion connector 40 extends generally along the entire length of the center portion 46.

Thus, a head 54 (shown schematically) may be coupled to leads 44 on either tab 30 or 32 as desired so that wires 56 coupled to head 54 extend from either side A or B of the connector board 20 to connect to a lead-connector pad-insertion connector operating circuit portion. Although, the integrated connector board 20 illustrated in FIG. 1 has multiple lead-connector pad-insertion connector operating circuit portions for use, the invention is not limited to a connector board 20 having multiple operating circuit portions.

Figure 2:
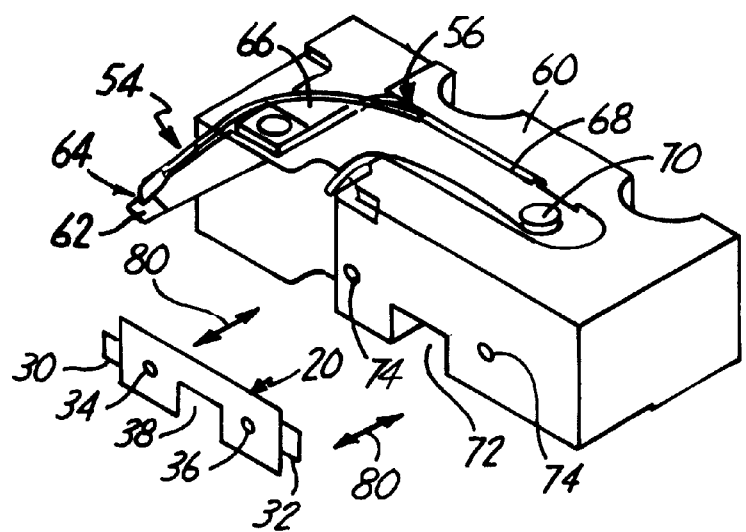
FIG. 2 is a perspective view of a testing block having an integrated connector board mounted thereto to electrically connect a head to electronic circuitry of a testing apparatus.

As previously explained, heads 54 are tested to assure the proper operating parameters for the head 54. The electrical characteristics and fly characteristics of the head may be tested via cooperation with a disc in a known manner. FIG. 2 illustrates an embodiment of a testing block 60 for supporting head 54 for testing by a testing assembly incorporating a pin type connector terminal. Head 54 includes a slider 62, supporting transducers for reading and writing data to disc. Slider 62 is coupled to a gimbal spring and load beam to form HGA 64 which is supported to fly above a lower disc surface via the testing block 60.

Testing block 60 includes a head support 66, a wire track 68, spool 70, channel 72 and head connector board mounting holes 74. HGA 64 is removably supported at head support 66 so that the slider 62 or head of the HGA 64 is aligned upwardly to read a disc mounted above the HGA 64. Wires 56 are coupled to transducers of head 54 and to leads 44 on tabs 30, 32 for providing an electrical connection to test circuitry.

Preferably, wires 56 are coupled to leads 44 via a wire bonding process. As illustrated by arrows 80, the integrated connector board 20 is mounted relative to the testing block 60 via mounting holes 34, 36 of connector board 20 and holes 74 on block 60. Preferably, the testing block 60 is formed of a metal (conductive) material. Thus, the thickness of the base 22 of the connector board 20 of the present invention is designed to reduce the capacitance affect between the connector board 20 and testing block 60 so that the capacitance is acceptably low and does not affect the test results. Preferably, the base 22 of the connector board 20 is formed of a non-conductive material having a thickness of 5.0 mil or thicker to reduce the capacitance effect between the connector board 20 and the testing block 60.

The testing block 60 is coupled to an actuator assembly (not shown) via channel 72 to move HGA 64 relative to a test disc (not shown) for testing. Recessed channel 38 couples with channel 72 of testing block 60. Wires 56 extend from head 54 along wire track 68 and about spool 70 to leads 44 on connector board 20.

Figure 3:
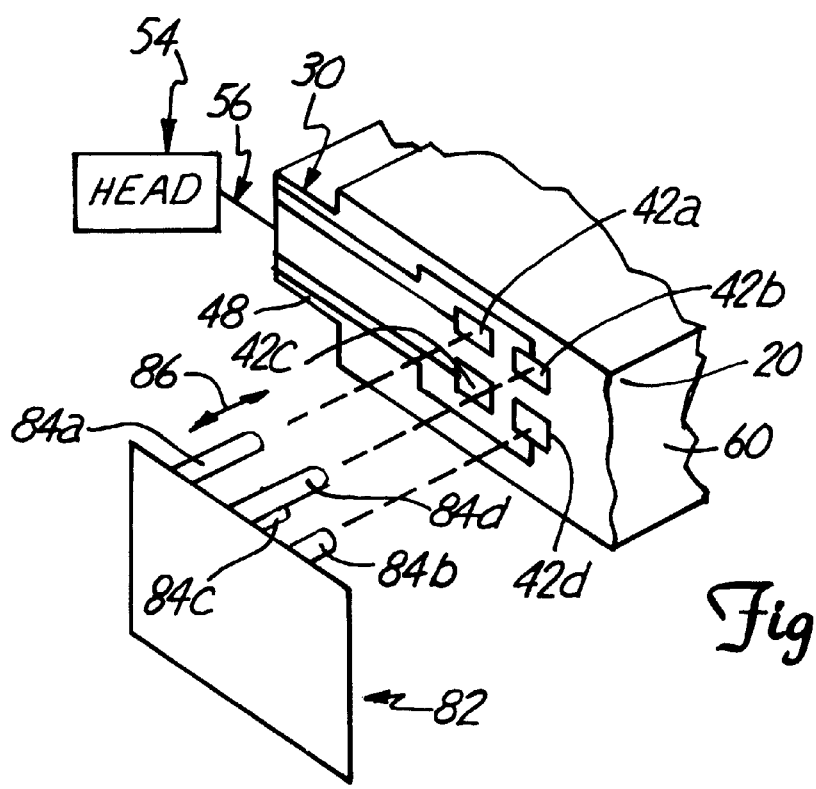
FIG. 3 is a schematic view illustrating an electrical connection between the integrated connector board of the present invention and a pin type connector terminal of a testing apparatus.

Connector board 20 electrically connects wires 56 from head 54 to test circuitry. FIG. 3 illustrates a pin type connector terminal 82 cooperating with the integrated connector board 20 for electrically connecting wires 56 of head 54 to test circuitry. As shown in FIG. 3, connector terminal 82 includes an array of pins 84 for connecting multiple wires 56 to test circuitry. Pins 84 electrically connect to connector pads 42a–d of circuits 24a–d to provide an electrical connection between head 54 and electric circuitry of the testing apparatus.

As shown, the terminal connector 82 (and pins 84) is designed to operate between a retracted position (shown) spaced from connector board 20 and a connected position (not shown) so that pins 84a–d contact connector pads 42a–d. The connector pads 42 of circuits 24a–d are aligned so that pins 84 contact connector pads 42 in the connected position (not shown). In particular, for operation, terminal connector 82 is moved as illustrated by arrow 86 to the connected position. Preferably, the pins 84a–d are arranged in a rectangular shaped array and similarly connector pads 42 are arranged in a rectangular shaped array.

In the embodiment shown, the connector board 20 is designed for testing a magnetoresistive head (MR) head having an inductive write element and a MR read element. Two wires are used for the inductive write element and two wires are used for the MR read element. The four wires for the MR head are coupled to four leads 44a–d on either tab 30 or 32 which are coupled to four connector pads 42a–d. Pins 84a–d selectively couple to connector pads 42a–d on either side portion 48 or 50 to provide an electrical connection between wires of the head and the testing apparatus circuitry.

As shown in FIG. 2, the head support 66 is positioned on side A of block 60 and thus wires 56 of the head 54 supported thereby are coupled to leads 44 on tab 30. Although block 60, illustrated in FIG. 2, shows HGA 64 mounted on side A, blocks 60 may include the head support 66 on either side A or B. If HGA 64 is mounted on side B (not shown), wires 56 would be connected to leads 44 on extension tab 32, and pins 84a–d of connector terminal 82 would contact connector pads 42 on side portion 50.

Thus, as described, a preferred embodiment of the connector board 20 allows the head to be connected to leads extending from either the left or right side of the connector board to electrically connect to connector pads 42 for coupling the head to a testing apparatus. In addition to securing the connector board 20 to a testing block 60, holes 34 and 36 can be used to support a head connected to board 20 for transport and facilitate removal of the wires from leads 44 so that the wires are not damaged.

Figure 4:
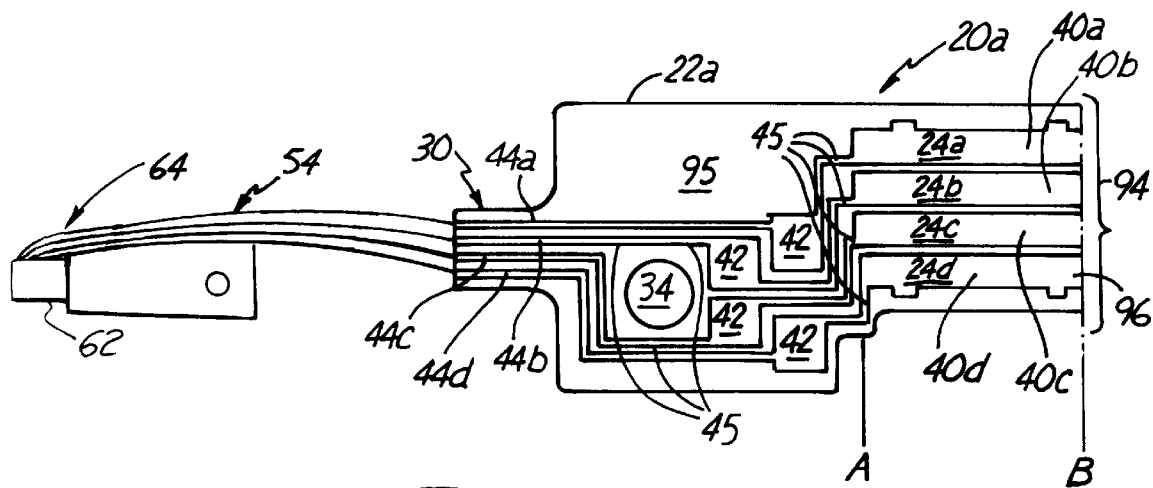
FIG. 4 is a plan view of insertion connectors of an integrated connector board of the present invention, formed on an insertable connector member for an insertion type connector terminal.

To adapt connector board 20 of FIG. 1 having side portions 48 and 50 extending from the center portion 46 for use with an insertion type connector terminal, connector board 20 may be severed along either lines 90—90 or 92—92 depending upon whether it is desired to have the wires 56 of the head connected to extension tab 30 or 32 to form connector board 20a of FIG. 4. The connector board 20 is severed to define an insertable member 94 including insertion connectors 40. If connector board 20 is severed along line 90—90, as shown in FIG. 4, then elongated insertion connectors 40, connective pads 42 on side portion 48 and leads 44 on tab 30 form the circuit for coupling the head wires 56 to the testing apparatus; and, if severed along line 92—92, elongated insertion connectors 40, connector pads 42 on side portion 50 and leads 44 on tab 32 form the circuits for coupling the head wires to the testing apparatus.

Preferably, a grounding bridge (not shown) is preferably soldered to leads 44a–d at either tab 30 or tab 32 to ground the head 54 for shunting the head 54 to minimize the potential for electrostatic discharge during shipping. In particular, if head wires 56 are coupled to leads 44a–d at tab 30, then bridge is coupled to leads 44a–d at tab 32. If head wires 56 are coupled to leads 44a–d at tab 32, then bridge is coupled to leads 44a–d at tab 30. If the bridge is coupled to leads 44a–d at tab 30, then the connector board 20 is severed along line 92—92 for use with an insertion type connector terminal. Alternatively if bridge is coupled to leads 44a–d at tab 32, then the connector board 20 is severed along line 90—90 for use with an insertion type connector terminal.

Alternatively, the connector board 20a of the present invention may be formed directly with an insertable member 94, an intermediate portion 95, and an extension tab 30 as shown in FIG. 4 so that the board 20 does not need to be severed to form insertable member 94. Thus, connector pads 42 would be formed on intermediate portion 95 and leads 44 on tab 30. The intermediate portion and tab 30 may extend from side A of insertable member 94 as shown in FIG. 4 or from side B of insertable member 94 (not shown).

Figure 5:
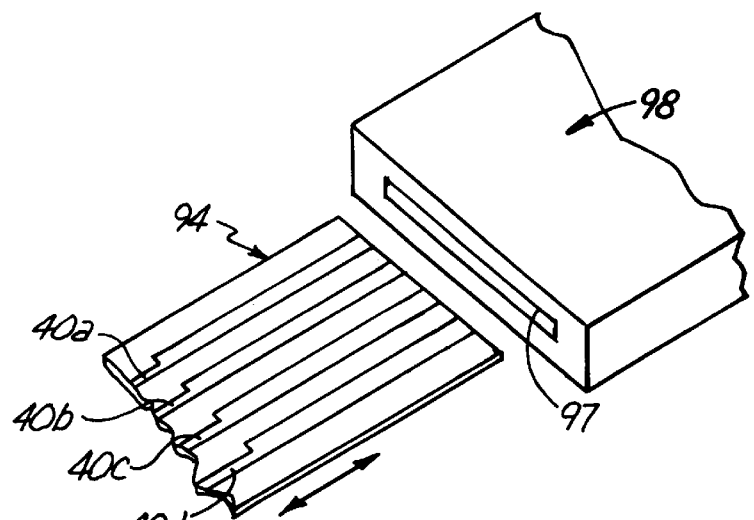
FIG. 5 illustrates insertion of the insertable connector member of the integrated connector board into an insertion type connector terminal.

The insertable member 94 shown in FIG. 4 is for an MR head having four insertion connectors 40a–d for each of the MR head four wires. The insertion connectors 40a–d extend in spaced parallel relation from a free edge 96 along the length of insertable member 94. As illustrated in FIG. 5, the insertable member 94 is designed for insertion into an opening 97 of an insertion type connector terminal 98 having parallely aligned spaced contacts (not shown). The connectors 40a–d are aligned and spaced similar to spaced contacts of the connector terminal 98 to electrically connect contacts to wires 56 coupled to connectors 40a–d via leads 44. The thickness of the insertion connectors 40a–d is as required inches.

Figure 6:
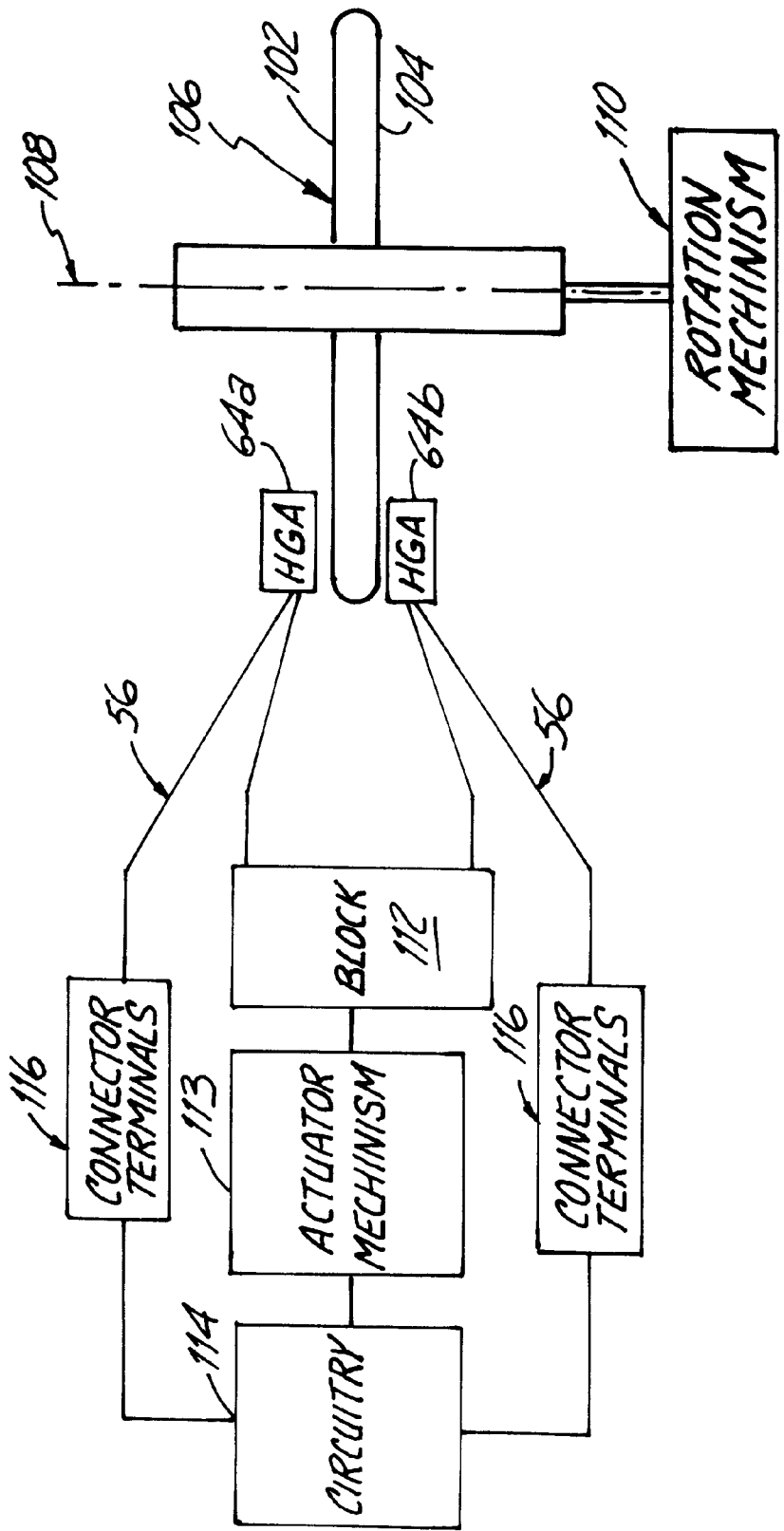
FIG. 6 is a schematic view illustrating a disc testing device for testing upper and lower disc surfaces having upper and lower test heads coupled to insertion type connector terminals of a testing apparatus.

Insertion type connector terminals are incorporated into disc testing apparatus such as disc testing apparatus available from Guzik Technical Enterprises, Inc. of San Jose, Calif. Disc testers test upper and lower disc surfaces 102 and 104 of a disc 106 as illustrated in FIG. 6. Preferably, disc 106 is supported for rotation about spindle axis 108 by a rotation mechanism 110. Upper and lower HGAs 64 are coupled to support block 112 to support the HGAs 64 relative to upper and lower disc surfaces 102 and 104. An actuator mechanism 113 moves block 112 to position HGAs 64 relative to selected data tracks. In particular, the air bearing surfaces of the slider 62 faces the disc surface 102 or 104 to fly above the disc surfaces so that the transducers can read to and write from the disc surface. Wires 56 of the HGAs 64 are coupled to electronic circuitry 114 of the testing apparatus via connector boards 20 (not shown) inserted into insertion type connector terminals (shown schematically) 116 coupled to electronic circuitry 114.

The connector board 20 illustrated in FIG. 1 may be used to couple head to electronic circuitry 114. First and second side portions 48 and 50 of connector board 20 of FIG. 1 are mirror images. Upper HGA 64a is mounted to the extension tab 30 coupled to the first side portion 48 and lower HGA 64b is mounted to extension tab 32 coupled to second side portion 50. To align upper and lower HGAs 64a–d relative to the upper and lower disc surfaces 102 and 104, HGA 64a, and connector board 20a (not shown) are positioned facing upwardly and HGA 64b and connector board 20b (not shown—connector board 20 severed along line 92—92) are positioned facing downwardly. Since first and second sides are mirror images, the connector boards for HGAs 64a–d have the same profile for insertion into connectors 116.

The connector board 20 of the present invention coupled to HGAs 64 facilitates use of a test device having insertion type connector terminals as well as a test device having pin type connector terminals. Either embodiment of connector board 20 or 20a described and illustrated in FIGS. 1 and 4 can be used to connector to pin type connector terminals and insertion type connector terminals. However, prior to use for a insertion type connector terminal the embodiment of connector board 20 illustrated in FIG. 1, must be severed along either line 90—90 or line 92—92 to define an insertable member 94. As shown, in the embodiment of connector board 20 illustrated in FIG. 1, multiple holes 34 and 36 may be used to secure the connector board 20 to testing block 60.

Figure 7:
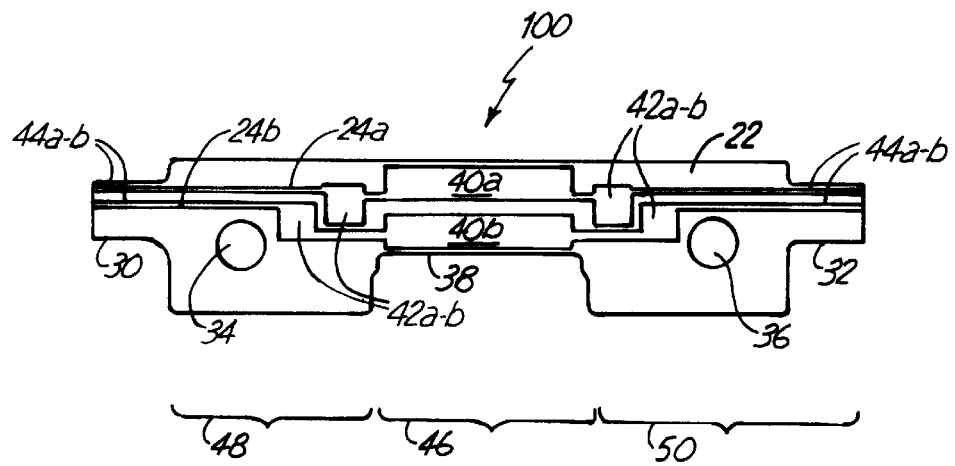
FIGS. 7–8 are plan views of alternate embodiments of the integrated connector boards of the present invention for alternate heads.
Figure 8:
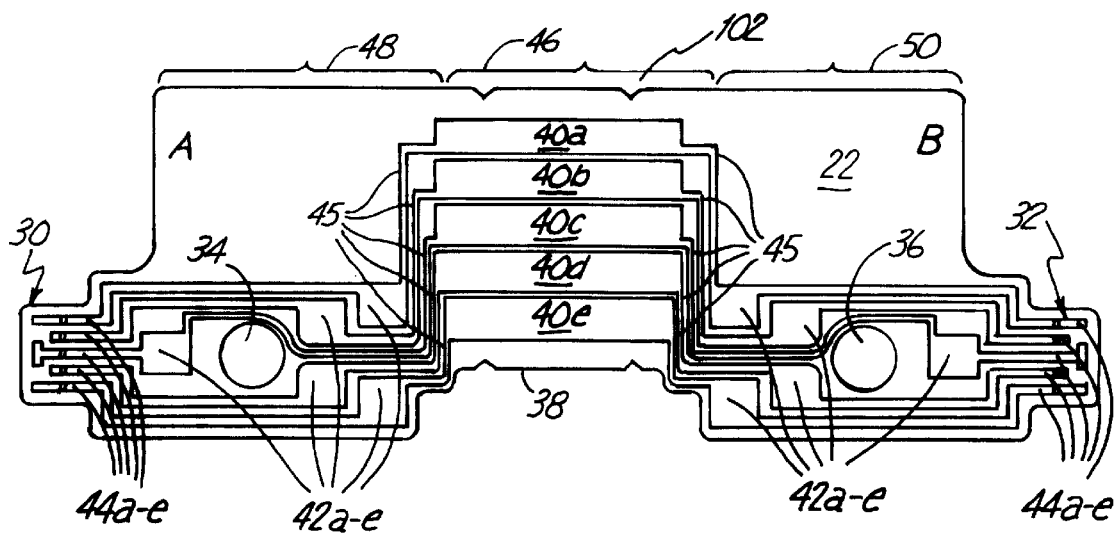

The connector board 20 illustrated in FIG. 1 is designed for an MR head having four wires for operation. FIGS. 7–8 illustrate alternate embodiments of connector boards 100 and 102 for an inductive read and write head having two wires for operation and a dual strip magnetoresistive head having five wires for operation, respectively. Like numbers in FIGS. 7–8 refer to like parts in FIG. 1. As shown in FIG. 7, connector board 100 in FIG. 7 has two circuits 24a–b; and, as shown in FIG. 8, connector board 102 has five circuits 24a–e. It should be noted that it is not necessary to include separate connector boards 20, 100, 102 for different heads and a single connector board can be designed with multiple circuits, preferably at least five, to accommodate various heads. If a single connector board is used then the number of circuits used depends upon the number required to electrically couple the wires of the operation elements of the head to the testing apparatus.

Thus, as described, the integrated circuit board of the present invention eliminates the need to connect wires to multiple connectors to use various testing apparatus incorporating different connector terminals. Wires may be bonded to a single connector board which then can be used in multiple testing apparatus incorporating different connector terminals.

Although the present invention has been described with reference to preferred embodiments, workers skilled in the art will recognize that changes may be made in form and detail without departing from the spirit and scope of the invention.

What is claimed is:

1. A method for connecting heads of a data storage system to testing apparatus incorporating insertion type connectors and pin type connectors comprising the steps of:

providing a connector board having a base and the base including:

a center portion;

first and second side portions extending from opposed sides of the center portion;

leads coupled to the base;

connector pads formed on the first and second side portions and electrically coupled to the leads; and elongated insertion connectors formed on the center portion of the base and electrically coupled to the connector pads on the first and second side portions and the leads;

electrically connecting wires of a head to the leads of the connector board;

positioning the connector board relative to a first testing apparatus incorporating a pin type connector terminal to align the connector pads with pins of the pin type connector terminal; and moving the pins from a retracted position to a connected position to contact the connector pads to electrically connect the head to electronic circuitry of the first testing apparatus.

2. The method of claim 1 further comprising the steps of:

severing the center portion of the connector board adjacent one of said first or second side portions to separate the center portion from the one of said first or second side portions to form an insertable member supporting the insertion connectors; and inserting the insertable member into an insertion type connector terminal of a second testing apparatus.

3. The method of claim 1 wherein wires of the head are connected to leads on one of the first or second side portions of the connector board and further comprising the steps of:

providing a grounding bridge to ground the connector board; and electrically connecting the grounding bridge to leads on another of the first or second side portions of the connector board.

4. The method of claim 3 further comprising the steps of:

severing the center portion of the connector board adjacent said side portion having the grounding bridge coupled thereto to separate the center portion from the side portion having the grounding bridge coupled thereto to form an insertable member supporting the insertion connectors; and inserting the insertable member into an insertion type connector terminal of a second testing apparatus incorporating an insertion type connector terminal.

5. A method for connecting heads of a data storage system to testing apparatus comprising the steps of:

providing a connector board having a base and the base including:

a center portion;

first and second side portions extending from opposed sides of the center portion;

leads coupled to the base;

connector pads formed on the first and second side portions and electrically coupled to the leads; and elongated insertion connectors formed on the center portion of the base and electrically coupled to the connector pads on the first and second side portions and the leads;

electrically connecting wires of a head to the leads of the connector board;

severing the center portion of the connector board adjacent one of said first or second side portions to form an insertable member supporting the insertion connectors; and inserting the insertable member into an insertion type connector terminal of a first testing apparatus.

6. The method of claim 5 further comprising the steps of:

positioning ing the connector board relative to a second testing apparatus incorporating a pin type connector terminal to align the connector pads with pins of the pin type connector terminal; and moving the pins from a retracted position to a connected position to contact the connector pads to electrically connect the head to electronic circuitry of the second testing apparatus for testing.

7. A method for connecting heads of a data storage system to a testing apparatus comprising the steps of:

providing a connector board including a base having leads coupled to the base;

connector pads formed on the base and electrically coupled to the leads;

elongated insertion connectors formed on the base and electrically coupled to the leads and connector pads;

electrically connecting wires of a head to leads of the connector board; and selectively connecting one of the connector pads or insertion connectors to electronic circuitry of a first testing apparatus.

8. The method of claim 7, further comprising the steps of:

disconnecting the one of the connector pads or insertion connectors from electronic circuitry of the first testing apparatus; and connecting another of the connector pads or insertion connectors to electronic circuitry of a second testing apparatus.

* * * * *